(12) United States Patent
Astafiev et al.

(10) Patent No.: US 11,112,442 B2
(45) Date of Patent: Sep. 7, 2021

(54) QUANTUM POWER SENSOR AND METHOD OF MEASURING POWER IN TRANSMISSION LINES

(71) Applicant: NPL MANAGEMENT LIMITED, Middlesex (GB)

(72) Inventors: Oleg Vladimirovich Astafiev, Surrey (GB); Rais Shaikhaidarov, Surrey (GB); Vladimir Nikolaevich Antonov, Surrey (GB); Teresa Clare Hoenigl-Decrinis, Surrey (GB); Sebastian Erik De Graaf, Middlesex (GB)

(73) Assignee: NPL MANAGEMENT LIMITED, Middlesex (GB)

( * ) Notice: Subject to any disclaimer, the term of this patent is extended or adjusted under 35 U.S.C. 154(b) by 0 days.

(21) Appl. No.: 16/333,895

(22) PCT Filed: Sep. 15, 2017

(86) PCT No.: PCT/GB2017/052749
§ 371 (c)(1),
(2) Date: Mar. 15, 2019

(87) PCT Pub. No.: WO2018/051123
PCT Pub. Date: Mar. 22, 2018

(65) Prior Publication Data
US 2019/0204372 A1  Jul. 4, 2019

(30) Foreign Application Priority Data
Sep. 19, 2016 (GB) .................................... 1615902

(51) Int. Cl.
*G01R 29/08* (2006.01)
*G01R 1/24* (2006.01)
*H01F 38/14* (2006.01)

(52) U.S. Cl.
CPC .......... *G01R 29/0878* (2013.01); *G01R 1/24* (2013.01); *H01F 38/14* (2013.01)

(58) Field of Classification Search
CPC ...... G01R 29/0878; G01R 21/00; G01R 1/24; G01R 33/60; H01F 38/14; H03K 19/195;
(Continued)

(56) References Cited

U.S. PATENT DOCUMENTS

| | | | | |
|---|---|---|---|---|
| 6,900,454 B2 * | 5/2005 | Blais | ...................... | B82Y 10/00 257/14 |
| 7,230,266 B2 * | 6/2007 | Hilton | .................... | B82Y 10/00 257/31 |

(Continued)

FOREIGN PATENT DOCUMENTS

| | | |
|---|---|---|
| CN | 1419660 A | 5/2003 |
| CN | 101399425 A | 4/2009 |
| CN | 103760416 A | 4/2014 |

OTHER PUBLICATIONS

Astfiev O et al: "Resonance Fluorescence of a Single Artificial Atom", arxiv.org, Cornell University Library, 201 OLIN Library Cornell University Ithaca, NY 14853, Feb. 26, 2010.
(Continued)

*Primary Examiner* — Vinh P Nguyen
(74) *Attorney, Agent, or Firm* — Foley & Lardner LLP (57) ABSTRACT

A quantum power sensor has a two-level quantum system strongly coupled to a transmission line that supports a propagating wave. A method of measuring power in a transmission line includes coupling a two-level quantum system to the transmission line; and determining the coupling and the Rabi frequency of the two-level system.

9 Claims, 9 Drawing Sheets

(58) Field of Classification Search
CPC .... H03K 19/08; H03K 19/19; H03K 19/1954; H03K 19/1958; H01L 27/28; H01L 39/223; H01L 39/025; H01L 29/66977; H01L 39/22; G06N 10/00
See application file for complete search history.

(56) References Cited

U.S. PATENT DOCUMENTS

| | | | |
|---|---|---|---|
| 7,932,514 | B2 | 4/2011 | Farinelli et al. |
| 8,111,083 | B1 * | 2/2012 | Pesetski ................. H03K 17/92 326/3 |
| 9,425,804 | B2 | 8/2016 | McDermott, III et al. |
| 9,843,312 | B2 * | 12/2017 | Abdo ........................ H01P 5/02 |
| 9,870,536 | B1 * | 1/2018 | Abdo .................... H01L 39/223 |
| 10,707,812 | B2 * | 7/2020 | Abdo ..................... H03D 7/005 |
| 10,734,778 | B2 * | 8/2020 | Breeze .................... B82Y 10/00 |
| 2009/0289638 | A1 | 11/2009 | Farinelli et al. |
| 2011/0012619 | A1 | 1/2011 | Ketchen et al. |
| 2016/0233965 | A1 * | 8/2016 | Medford ................ G06N 10/00 |

OTHER PUBLICATIONS

Io-Chun Hoi et al: "Microwave quantum optics with an artificial atom in one-dimensional open space", New Journal of Physics, Institute of Physics Publishing, Bristol, GB, vol. 15, No. 2, Feb. 7, 2013, p. 25011.

Kinoshita M et al: "Determination of the Microwave Field Strength Using the Rabi Oscillation for a New Microwave Power Standard", IEEE Transactions on Instrumentation and Measurement, IEEE Service Center, Piscataway, NJ, US, vol. 58, No. 4, Apr. 1, 2009, pp. 1114-1119.

Lindstrom Tobias: "Microphoton 2016", Apr. 14, 2016, XP055428850.

Z.H. Peng et al: "Tuneable on-demand single-photon source in the microwave range", Nature Communications, vol. 7, Aug. 22, 2016, p. 12588.

Chinese Office Action dated Nov. 11, 2020, from application No. 201780062352.1

European Office Action dated Jan. 21, 2021, from Application No. 17771558.8.

Jiang Xingfei, Research on Millimeter-wave Power Values Transfer Technology, Jul. 2014, 64 Pages.

Hönigl-Decrinis, et al., "Two-level System as a Quantum Sensor of Absolute Power", Microphoton workshop, 2016, 1 page.

Chinese Office Action dated Jun. 28, 2021, from application No. 201780062352.1.

* cited by examiner

QUANTUM POWER SENSOR AND METHOD OF MEASURING POWER IN TRANSMISSION LINES

The present invention relates to power sensors, in particular sensors for measuring absolute power of microwave signals in cryostats.

Many devices that operate at low temperature, such as quantum devices and superconducting qubits, use or process microwave signals, that is signals with frequencies in the range of from 1 to 50 GHz. Such signals are transmitted over transmission lines. Progress in development of microwave superconducting circuitry, in particular for application to quantum computing and quantum optics, demands calibration of microwave lines and knowledge of applied powers to the circuits situated at low temperatures. To date, there is no method for measuring the absolute power of a microwave signal in a continuous transmission line at low temperatures, e.g. less than 5 K. US 2009/0289638 discloses an arrangement for measuring the state of a qubit by measuring the power of a standing wave in a transmission line cavity that supports a single mode. Known power meters and spectral analysers rely on semiconductor-based electronics that do not function at low temperatures.

Therefore, it is necessary to bring a microwave signal to be measured out of the cryostat so that its power can be measured at room temperature. However, the power measured at room temperature cannot accurately indicate the power at the point of interest inside the cryostat because the attenuation of the transmission line between the point of interest and the room temperature measuring device cannot be known for certain: it could only be measured indirectly, for example in a separate experiment which would introduce additional uncertainty. The transmission lines and cryogenic elements cannot be calibrated at room temperature because the properties of microwave lines and components change drastically when they are cooled down to cryogenic temperatures.

There is therefore a need for a method of measuring the absolute power of a microwave signal on a low-temperature transmission line.

According to an aspect of the invention, there is provided a quantum power sensor comprising a two-level quantum system coupled to a transmission line that supports a propagating wave.

Embodiments of the present invention can be used to measure the microwave power in any type of implementation of a transmission line, such as an uninterrupted microwave waveguide interfaced to and part of an external transmission line made out of the same or any other implementation, or as part of an interrupted ('continuous') transmission line supporting both partial and/or complete reflections of a propagated microwave signal. The transmission line can be of any type, including 2D and 3D waveguides and made of any material such that the transmission line supports a propagating wave. The transmission can have a wide bandwidth supporting a range of frequencies and, for example, can be a continuous 2D planar transmission line defined by metallisation on a silicon chip.

The present invention enables the measurement of power in any implementation of a transmission line by using a two-level system to yield a measurement of microwave power.

In an embodiment of the invention, the transmission line has a bandwidth of 0.5 GHz or more, desirably 1.0 GHz or more.

In an embodiment of the invention, the transmission line supports a propagating wave having a frequency in the range of from 1 to 20 GHz.

An embodiment of the invention further comprises an analyser configured to measure the coupling of the two-level system to the transmission line and the Rabi frequency of the two-level system.

In an embodiment of the invention, the analyser is a spectrum analyser or vector network analyser connected to the transmission line.

In an embodiment of the invention, the analyser is configured to operate at room temperature.

The invention also provides a measurement system comprising a quantum power sensor as described above and an object device which is to be measured.

In an embodiment of the invention, the object device is connected between the transmission line and the analyser.

In an embodiment of the invention, the analyser is connected to an input to the transmission line and the object device is connected to an output of the transmission line.

In an embodiment of the invention, the analyser is connected to the transmission line by an element with directivity.

An embodiment of the invention further comprises a power source connected to the transmission line and a control system for controlling the power source in response to the analyser.

A In an embodiment of the invention, the object device is connected to an input to the transmission line and the analyser is connected to an output of the transmission line.

An embodiment of the invention further comprises, a control source coupled to the input to the transmission line by an element with directivity.

In an embodiment of the invention, the two-level quantum system is capacitively coupled to the transmission line.

In an embodiment of the invention, the two-level quantum system is inductively coupled to the transmission line.

In an embodiment of the invention, the two-level quantum system is a system selected from the group consisting of: superconducting qubits; single-electron two-level systems; nuclear spin qubits; quantum dots; defect qubits; trapped ion qubits.

In an embodiment of the invention, the two-level quantum system and the transmission line are configured to operate at low temperatures.

The present invention also provides a method of measuring power in a transmission line, the method comprising:
coupling a two-level quantum system to the transmission line; and
determining the coupling and the Rabi frequency of the two-level system.

In an embodiment of the invention, the coupling is measured by direct transmission through the transmission line and the Rabi frequency is measured by Rabi oscillation measurements.

In an embodiment of the invention, the coupling is deduced by measuring the relative amplitude of a third and higher order mixing product and the Rabi frequency is measured by resonance fluorescence measurements.

In an embodiment of the invention, the coupling and the Rabi frequency are deduced by measuring the relative amplitude and frequency and power dependences of third and higher order mixing products as a result of driving the two-level system with two or more frequencies.

With such a construction, a measurement of absolute power at low temperature can be made by measuring a spectrum at room temperature. Although the attenuation of the circuit from the point of interest to the room temperature measurement of a spectrum is still not known, that does not matter because the spectrum shape only depends on relative power not absolute power.

Embodiments of the invention will be described below with reference to the accompanying drawings, in which.

In the Figures, like parts are indicated by like references.

An embodiment of the present invention provides a quantum system coupled to the transmission line so as to act as a quantum sensor of absolute power. The principle of operation of the invention is described further below with reference to FIG. 1. A proof of concept has been performed using an arrangement, depicted in FIGS. 6 and 7, comprising superconducting artificial atoms coupled to a coplanar 1D transmission line. The artificial atoms have different coupling strengths, are highly nonlinear and can be approximated as two-level systems.

Figure 1:
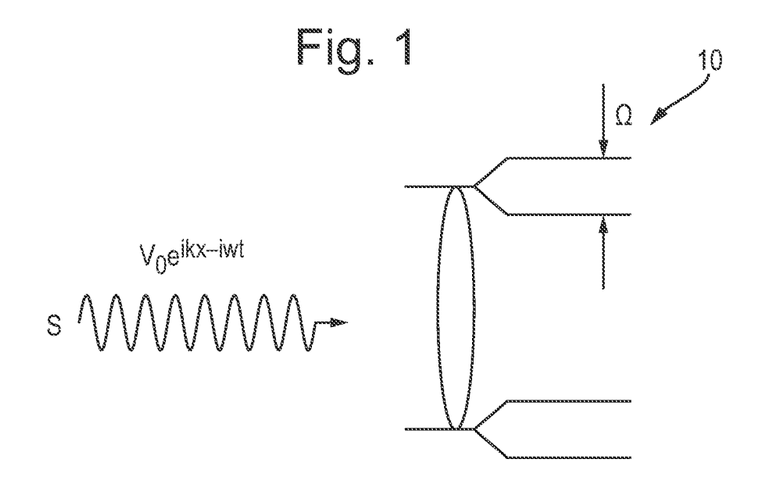
FIG. 1 depicts a two-level quantum system illuminated by electromagnetic waves.

As shown in FIG. 1, when a quantum two-level system 10 is illuminated by an electromagnetic wave S, only a fraction of the incident photons is absorbed, with rate Q. The incident electromagnetic wave S, which is guided along a transmission line, couples to the two-level system 10 via the dipole moment μ:

$$\hbar\Omega = \mu I \text{ or } \hbar\Omega = \mu V \quad (1)$$

where I and V are amplitudes for an inductively or capacitively coupled two-level system 10 respectively. The dipole moment characterizes the coupling strength between the two-level system and the transmission line and therefore may be referred to as the coupling coefficient.

In an embodiment of the invention, the Rabi frequency $\Omega$ and the coupling $\mu$ of the two-level system 10 to the transmission line 20 is to be found. This pair of parameters can be obtained using different methods. For example, by measuring the coherent emission of the artificial atoms, quantum oscillation measurements may be performed to extract the Rabi frequency and the coupling can be found by measuring the transmission through the coplanar transmission line as a function of detuning $\delta\omega$ and driving amplitude. These two quantities are sufficient to calibrate absolute power. However, coherent emission can be affected by dephasing of the artificial atoms.

Figure 10:
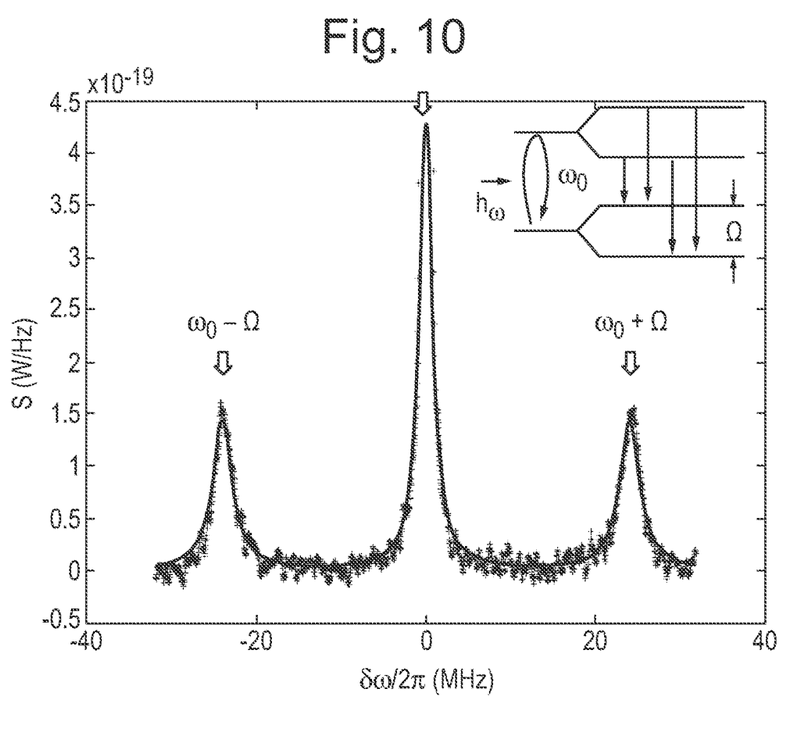
FIG. 10 is a power spectrum of one of the qubits of FIG. 6 under a strong resonant drive.

To make the measurement independent of dephasing, wave scattering by means of resonance fluorescence and wave mixing can be used. The Rabi frequency can be obtained from the resonance fluorescence triplet. Under strong resonant drive the energy levels of the two-level system are split allowing the four transitions as shown in the inset of FIG. 10 resulting in the resonance fluorescence triplet. The two side peaks of the triplet are separated by $2\Omega$. The coupling can be deduced by measuring the third order peak that appears due to wave mixing processes. Another method comprises measuring higher order mixing and deducing the Rabi frequency and the coupling from fitting the high order peaks to an analytical formula. Experimental results show that the absolute power calibration is independent of dephasing and the artificial atom as long as it is coupled to the transmission line 20.

This process is explained in more detail with reference to the proof of concept (FIG. 6), in which the two-level quantum system is a superconducting flux qubit 11 consisting of an Al superconducting loop 12 and four Al/AlO$_x$ Josephson junctions 13), threaded by a bias flux $\Phi_b$, close to a half flux quantum $\Omega_0/2$, and capacitively coupled to a 1D transmission line 20. The bias flux is controlled to tune the two-level system to the signal to be measured. In an experimental set-up, seven such qubits were capacitively coupled to a transmission line on a silicon substrate 22 with three of them being coupled more weakly than the remaining four. A gold layer 23 is provided to enable connections to the transmission line 20 and to ground the ground plane 21. In an experimental set-up, seven such qubits were capacitively coupled to a transmission line on a silicon substrate 22 with three of them being coupled more weakly than the remaining four. Due to the large anharmonicity of the flux qubit, it can be approximated as a two-level system.

Figure 6:
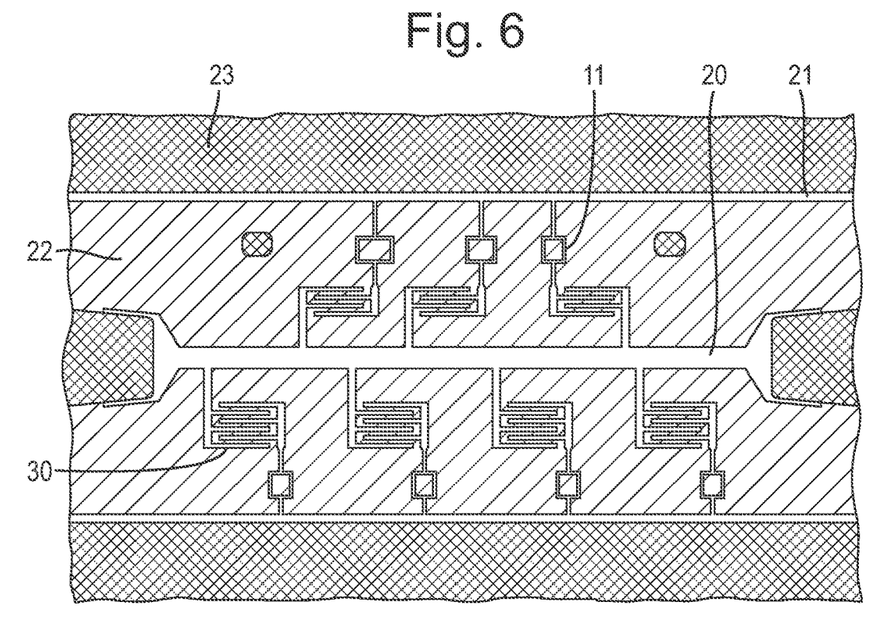
FIG. 6 is a plan view of an experimental set-up having multiple qubits capacitively coupled to a transmission line.

The two-level atom driven by a resonant microwave is described in the rotating wave approximation by the Hamiltonian $$H = -\frac{\omega_0}{2}\sigma_z + \frac{\hbar\Omega}{2}(\sigma^+ e^{i\phi} + \sigma^- e^{-i\phi})$$

where $\omega_0 = \sqrt{\omega_a^2 - \in^2}$ is the anti-crossing energy between the two persistent current states, $\hbar \Omega = \mu V$ is the dipole interaction energy and $\sigma^\pm = (\sigma_x \pm i\sigma_y)/2$ with the Pauli matrices $\sigma_x$, $\sigma_y$, $\sigma_z$.

The dynamics of the system are governed by the master equation $$\dot{\rho} = -\frac{i}{\hbar}[H, \rho] + \hat{L}[\rho]$$

where $\hat{L}[\rho] = -\Gamma_1 \sigma_z \rho_{11} - \Gamma_2 (\sigma^+ \rho_{10} + \sigma^- \rho_{01})$ at zero temperature, where $\Gamma_1$ is the two-level system relaxation rate, solely determined by radiative emission to the line (nonradiative relaxation is negligible).

If the artificial atom is driven close to its resonance frequency $\omega_0$ it acts as a scatterer and hence generates two coherent waves propagating forward and backward with respect to the driving field:

$$V_{sc}(x, t) = i\frac{\hbar \Gamma_1}{\mu} \langle \sigma^{-1} \rangle e^{ik|x| - i\omega t} \quad (2)$$

where $\mu$ is the atomic dipole moment and $\Gamma_1$ is the atomic relaxation rate with a photon emission into the line. These scattered waves are measured to deduce the power in the driving propagating wave. Solving the master equation and using Eq. 2, the stationary solution can be found:

$$t = 1 - \frac{\Gamma_1}{\Gamma_2} \frac{1 + i\delta\omega/\Gamma_2}{1 + (\delta\omega/\Gamma_2)^2 + \Omega^2/\Gamma_1\Gamma_2} \quad (3)$$

Thus the qubit resonance reveals itself as a sharp dip in the power transmission coefficient. A power extinction $1-|t|^2 > 85\%$ for all qubits in the experimental setup was achieved, which shows strong coupling to the environment and hence almost all emission is emitted into the transmission line.

In order to sense the absolute power, $W_O$, the two quantities that need to be measured are the coupling coefficient, $\mu$, and the Rabi frequency, $\Omega$.

Figure 7:
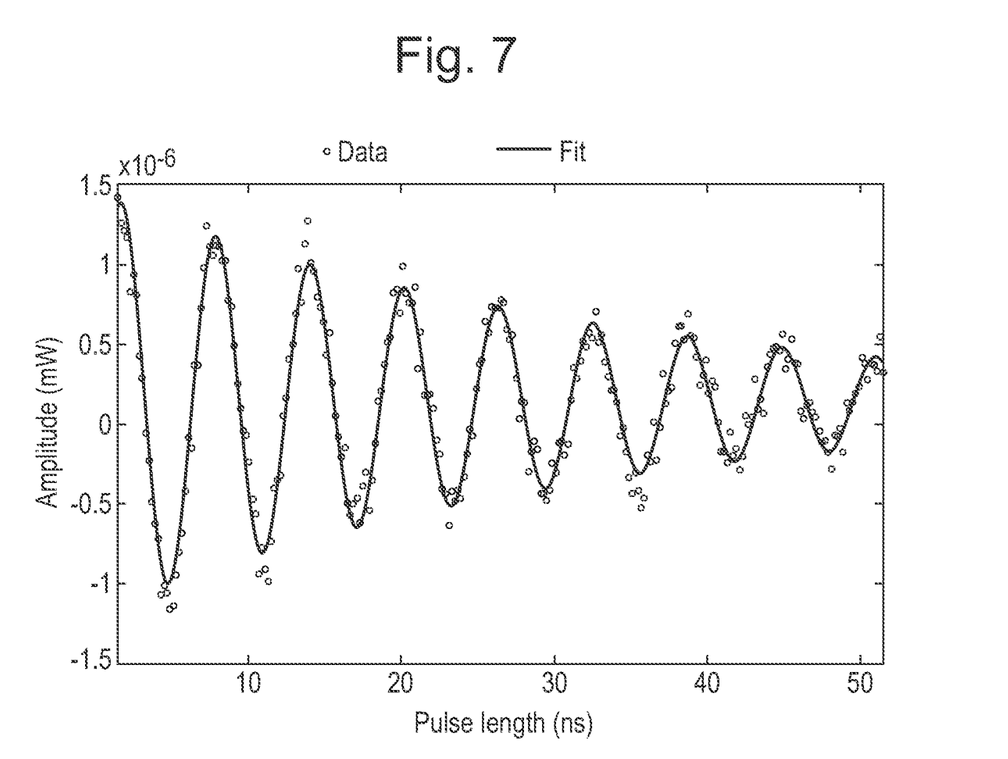
FIG. 7 is a graph of amplitude vs pulse length demonstrating Rabi oscillations in one of the qubits of FIG. 6.
Figure 8:
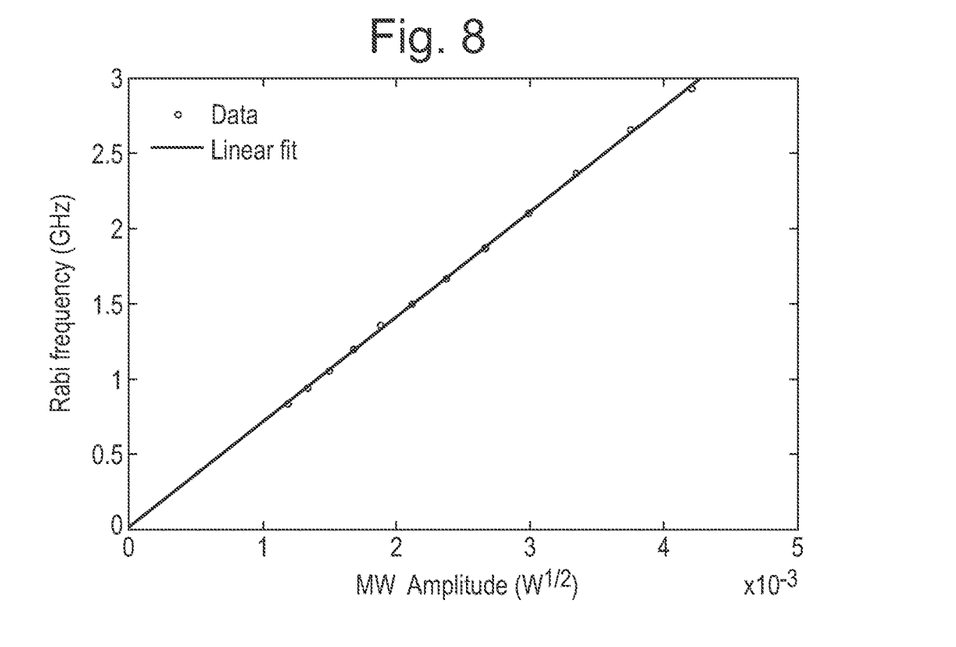
FIG. 8 is a graph of Rabi frequency measured using the method in FIG. 7 vs amplitude for one of the qubits of FIG. 6.

The Rabi frequency can be obtained by performing quantum oscillation measurements as depicted in FIG. 7. At the input, a continuous microwave signal is chopped by a rectangular pulse of varying pulse length from 1 ns to 1 ms, desirably from 1.5 ns to 50 ns, forming an excitation pulse that is delivered through coaxial cables to the sample (which is at low temperature, e.g. less than about 300 mK) exciting the atom. The output signal is amplified by a cryogenic amplifier and a room temperature amplifier and then chopped by a readout pulse of length from 1 ns to 1 ms, desirably about 50 ns. The emission of the atom is detected using a Vector Network Analyser (VNA). Rabi oscillations of the qubit for a frequency of 7.48 GHz were obtained at values of the microwave power, $W_{in}$, applied at room temperature ranging from −30 dBm to 0 dBm. By varying $W_{in}$, we find the linear relationship between the Rabi frequency and the microwave amplitude as depicted in FIG. 8.

Figure 9:
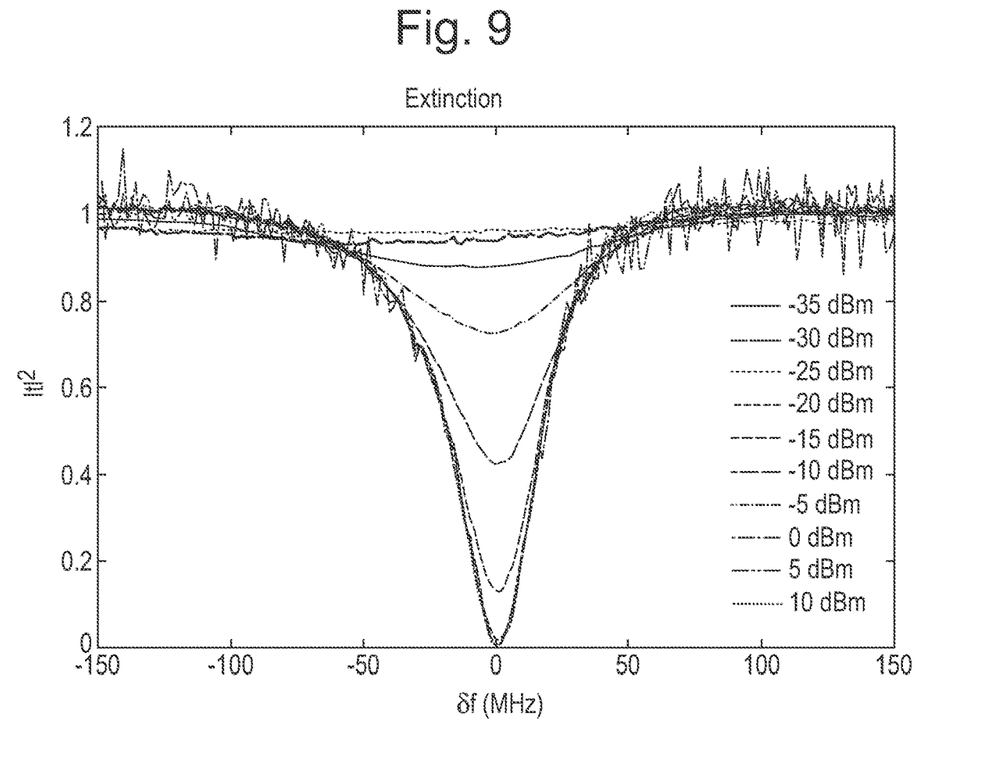
FIG. 9 is a graph of extinction vs frequency detuning for one of the qubits of FIG. 6.

The reflection coefficient is derived by measuring transmission through the coplanar line according to r=1−t. FIG. 9 shows $|t|^2$ as a function of incident wave detuning, $\delta\omega/2\pi$, for different input microwave powers.

In principle, obtaining the Rabi frequency from quantum oscillation measurements and deriving the coupling from measuring the transmission through the coplanar line is sufficient to sense the absolute power. However, potential drawbacks of this method are possible distortions at high powers in the transmission curve due to interference with leaked power. Furthermore, coherent emission is affected by dephasing. The present invention also encompasses an alternative method to attain the Rabi frequency and the coupling.

The atom coupled to a strong driving field ($\Omega \gg \Gamma_1$) can be described by the dressed-state picture where the atomic levels are split by $\Omega$ and four transitions are allowed between the dressed states giving rise to the Mollow triplet. To observe this triplet we measure the power spectrum using a spectrum analyser at 7.48 GHz under a strong resonant drive as shown in FIG. 10. The spectral density measured is expected to be:

$$S(\omega) \approx \frac{1}{2\pi} \frac{\hbar \omega \Gamma_1}{8} \left( \frac{\gamma_s}{(\delta\omega + \Omega)^2 + \gamma_s^2} + \frac{2\gamma_s}{\delta\omega^2 + \gamma_c^2} + \frac{\gamma_s}{(\delta\omega - \Omega)^2 + \gamma_s^2} \right). \quad (4)$$

Figure 11:
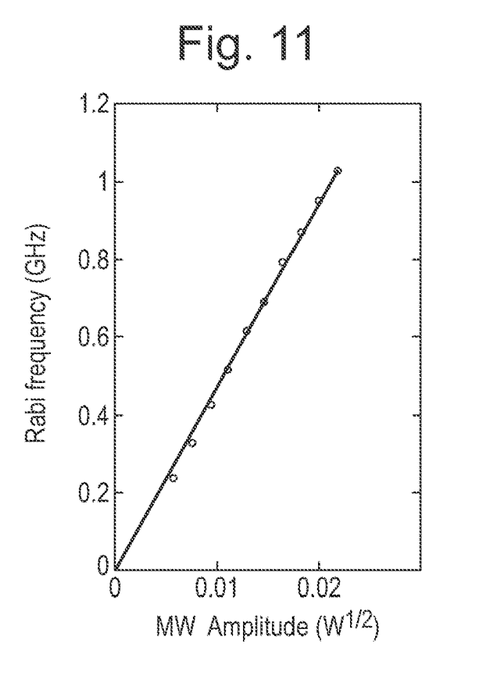
FIG. 11 is a graph of Rabi frequency measured using the method in FIG. 10 vs amplitude of one of the qubits of FIG. 6 under a strong resonant drive.
Figure 12:
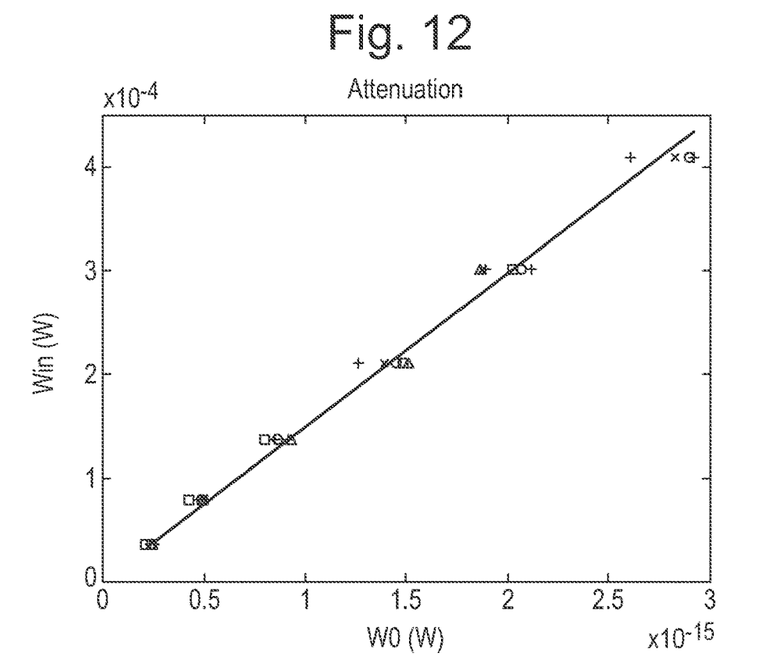
FIG. 12 is a graph of absolute power sensed as a function of driving power using the qubits of FIG. 6 under a resonant drive.
Figure 13:
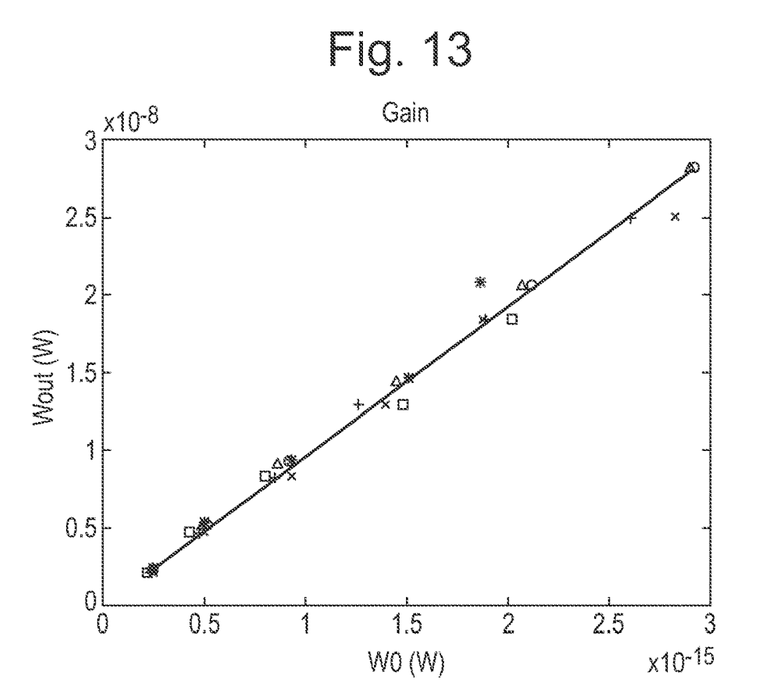
FIG. 13 is a graph of absolute power sensed as a function of output power using the qubits of FIG. 6 under a resonant drive.

We deduce the Rabi frequency from the separation of the Mollow triplet side peaks and find the linear relationship between the Rabi frequency and the input microwave amplitude, as shown in FIG. 11.

An alternative approach to acquire the coupling and $\Omega$ is to measure a side peak dependences that appears due to wave mixing processes. An analytical solution for the useful case of two close and equal frequency drives is presented below, however the solution can be generalized for arbitrary amplitudes and frequencies of the drives. The appropriate solutions can be found either analytically or numerically.

The artificial atom is driven by two continuous drives $\omega_1 = \omega_0 + \delta\omega - \Delta\omega$ and $\omega_2 = \omega_0 + \delta\omega + \Delta\omega$ with $\Delta\omega \ll \Gamma_2$. The elastic wave scattering on the artificial atom in a case when nonradiative decay is negligible (even more loose requirement than the strong coupling regime) then becomes:

$$V_{sc} = -\frac{\hbar \Omega}{\mu} \frac{\Gamma_1}{2\Gamma_2} \frac{1 + i\delta\omega/\Gamma_2}{1 + (\delta\omega/\Gamma_2)^2 + \Omega^2/\Gamma_1\Gamma_2} \quad (5)$$

with equal driving amplitudes $V = V_0 \cos(\omega_0 t - \Delta\omega t) + V_0 \cos(\omega_0 t + \Delta\omega t)$ and, therefore, $\Omega = \Omega_0 (e^{i\Delta\omega t} + e^{-i\Delta\omega t})$, where $\hbar \Omega_0 = \mu V_0$. Expanding eq. 5 in series of $\Omega$ we obtain:

$$V_{sc} = \frac{\hbar \Gamma_1}{2\mu} \sqrt{\frac{\Gamma_1}{\Gamma_2}} e^{i\varphi} \sum_{k=0}^{\infty} (-1)^{k+1} z^{2k+1} (e^{-i\Delta\omega t} + e^{i\Delta\omega t})^{2k+1}, \quad (6)$$

where $z = \dfrac{\Omega_0}{\sqrt{\Gamma_1 \Gamma_2} \sqrt{1 + (\delta\omega/\Gamma_2)^2}}$ and $\varphi = \tan\left(\dfrac{\delta\omega}{\Gamma_2}\right)$.

The expression can be simplified in the strong coupling regime when $\Gamma_2 = \Gamma_1/2$, however, we present here a more general regime, accounting dephasing ($\Gamma_2 > \Gamma_1/2$). By collecting the exponential terms we obtain expressions for the amplitude of the wave mixing peaks. Summing up all terms at frequency $\omega_0+\delta\omega\pm(2p+1)\Delta\omega$ we find the analytic solution for the amplitude of $\pm(2p+1)$ peak:

$$V_{2p+1} = \frac{\hbar\Gamma_1}{2\mu}\sqrt{\frac{\Gamma_1}{\Gamma_2}}e^{i\varphi}\sum_{k=p}^{\infty}\left[\frac{(2k+1)!}{(k+p+1)!(k-p)!}(-1)^{k+1}z^{2k+1}\right], \quad (7)$$

$$\text{where } V_{sc} = \sum_{p=0}^{\infty} V_{2p+1}(e^{i(2p+1)\Delta\omega t} + e^{-i(2p+1)\Delta\omega t}).$$

The expression of eq. 7 can be further simplified to $$V_{2p+1} = (-1)^{p+1}\frac{\hbar\Gamma_1}{2\mu}\sqrt{\frac{\Gamma_1}{\Gamma_2}}\frac{e^{i\varphi}}{y}\left(\frac{y-1}{y+1}\right)^{p+\frac{1}{2}}, \quad (8)$$

$$\text{where } y = \sqrt{1+4z^2} = \sqrt{1+\frac{4\Omega_0^2}{\Gamma_1\Gamma_2(1+(\delta\omega/\Gamma_2)^2)}}.$$

By fitting the side peaks that appear due to wave mixing to this analytic solution (eq. 8) $\Omega$ and the coupling can be extracted thus giving enough information to sense the absolute power.

Similarly, for the more general case of unequal drive amplitudes $V=V_0\cos(\omega_0 t-\Delta\omega t)+V_1\cos(\omega_0 t+\Delta\omega t)$, resulting in the two Rabi frequencies $\Omega_0$ and $\Omega_1$, the scattered wave amplitudes for each frequency harmonic $2p+1$ is given by the general expression $$V_{sc} = \frac{i\hbar\Gamma_1\langle\sigma^+\rangle}{\mu} = \quad (9)$$

$$\frac{\hbar\Gamma_1}{\mu}\frac{A}{\alpha}\sum_{p=0}^{\infty}\xi^p[(\Omega_0+\xi\Omega_1)e^{-i(2p+1)\delta\omega t}+(\xi\Omega_0+\Omega_1)e^{i(2p+1)\delta\omega t}].$$

where the expression is simplified by setting $$A = \frac{\Gamma_1\lambda}{2(\Gamma_1|\lambda|^2+\Gamma_2(\Omega_0^2+\Omega_1^2))},$$

$$\beta = \frac{2\Gamma_2\Omega_0\Omega_1}{\Gamma_1|\lambda|^2+\Gamma_2(\Omega_0^2+\Omega_1^2)},$$

$$\alpha = \sqrt{1-\beta^2},$$

$$\xi = -\sqrt{\frac{1-\alpha}{1+\alpha}} \text{ and}$$

$$\lambda = \Delta\omega - i\Gamma_2.$$

In the above example, the two-level system is driven with two frequencies, however, an embodiment of the invention can use any suitable combination of frequencies. The use of multiple frequencies results in inelastic wave scattering and higher order mixing products. The incident microwave power can be deduced from the amplitude and/or phase information of these mixing products.

It can therefore be seen that a two-level system directly incorporated into a transmission line can act as a quantum sensor of absolute power by enabling a spectrum or frequency response to be correlated to power. The requirement of strong coupling can be loosened to a weak coupling ($\Gamma_2 > \Gamma_1/2$) with only radiative decay to the line (negligible nonradiative relaxation). All required quantities then can be found by fitting the experimental dependences by plots of eq. 8 or eq. 9.

Figure 2:
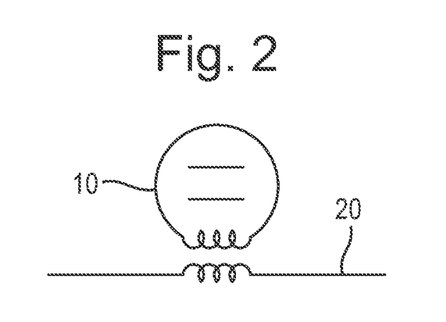
FIG. 2 depicts a two-level quantum system inductively coupled to a transmission line.
Figure 3:
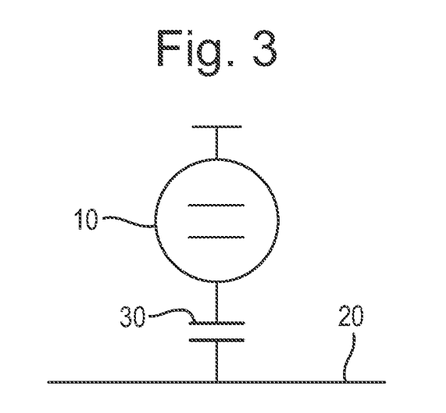
FIG. 3 depicts a two-level quantum system capacitively coupled to a transmission line.

Various arrangements for coupling the two-level system to a transmission line are possible. By way of example, FIG. 2 depicts a two-level system 10 inductively coupled to the transmission line 20. In effect, the transmission line and two-level system form a mutual inductance. FIG. 3 depicts a two-level system 10 capacitively coupled to transmission line 20 by capacitor 30.

The transmission line 20 can be any form of transmission line that supports a travelling (also referred to as a propagating) wave of suitable frequency. The transmission line can support either none, partial or full reflections of the signal at any frequency in the range 1-20 GHz at its ends. The frequency of the propagating wave may be in the range of from 1 GHz to 20 GHz. The transmission line desirably has a wide bandwidth, e.g. more than 0.5 GHz, desirably more than 1 GHz. The transmission line can be coupled to other transmission lines or other components. Desirably such coupling is impedance matched, e.g. at 50$\Omega$, so as to minimise reflections at any transitions, but any amount of reflections can be tolerated.

The two-level system 10 can be implemented as any form of two-level quantum system that is close to resonance with the microwave signal to be measured. The device is operated in the regime where higher levels that the system may have are not excited by the signal to be measured. Examples of two-level systems that can be used in embodiments of the invention include:

Superconducting qubits (based on Josephson Junctions): Charge, flux, and phase qubits, made from superconducting material, typically but not limited to Al.

Single electron ("semiconductor") type two-level systems (based on electron spin, or number of electrons)

Nuclear spin qubits (such as NV centres working at room temperature)

Quantum dots

Defects in materials

Trapped ions.

Figure 4:
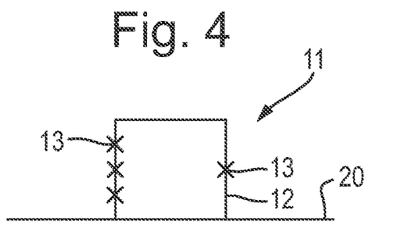
FIG. 4 depicts a superconducting flux qubit inductively coupled to a transmission line.
Figure 5:
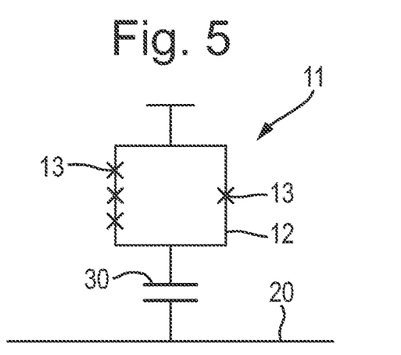
FIG. 5 depicts a superconducting flux qubit capacitively coupled to a transmission line

An advantage of superconducting qubits is that the coupling can easily be made strong. FIGS. 4 and 5 depict superconducting qubits 11 formed of superconducting loops 12 interrupted by Josephson junctions 13. In FIG. 4 the qubit is inductively coupled to the transmission line 20, in FIG. 5 it is capacitively coupled. In FIGS. 4 and 5, four Josephson junctions are shown however the qubit may have a different number of junctions, e.g. three. The two-level system is provided with a device for tuning it to the frequency of the signal to be measured. In a flux qubit, such a device can be an electromagnet configured to control the bias flux in the qubit.

Example uses of the quantum power sensor of the invention are depicted in FIGS. 14 to 18. It will be appreciated that other uses are also possible.

Figure 14:
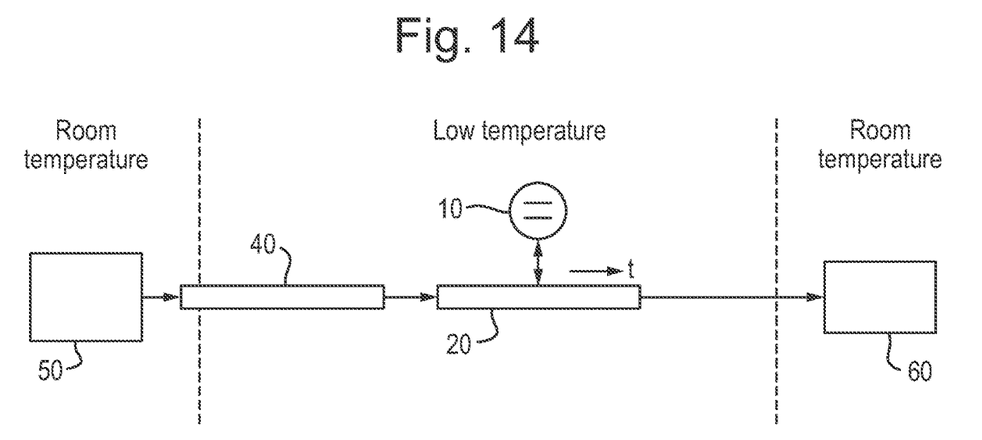
FIG. 14 depicts an arrangement of an embodiment of the invention to measure the attenuation of a low-temperature transmission line.

In the arrangement of FIG. 14, the quantum power sensor 10, 20 is used to measure the attenuation and/or reflection of a subject transmission line 40, for which these parameters are unknown. One or multiple power source(s) 50 of known output(s), which may be at room temperature, is coupled to one end of the subject transmission line 40, which may start at room temperature and end at a low temperature, e.g. less than 1 K. One end of transmission line 20 of the quantum power sensor is connected to the other end of subject transmission line 40 and the other end of transmission line 20 is coupled to a spectrum analyser or vector analyser 60, which may be at room temperature. As described above, the spectrum analyser or vector analyser 60 may be used to determine the Rabi frequency $\Omega$ and reflection coefficient r of the two-level system 10 and hence the power input to transmission line 20 may be determined. It is not necessary to measure the absolute power anymore since the two-level system converts a measurement of absolute power to a measurement of relative amplitudes (and spectral lineshape). Together with the known output of power source(s) 50, the reflection and/or attenuation of subject transmission line 40 can be determined. Subject transmission line 40 can be replaced with another element as a measurement subject to measure attenuation or reflection. If the spectrum analyser can measure absolute power at room temperature it is also possible to deduce the gain/attenuation in the transmission line returning to room temperature.

Figure 15:
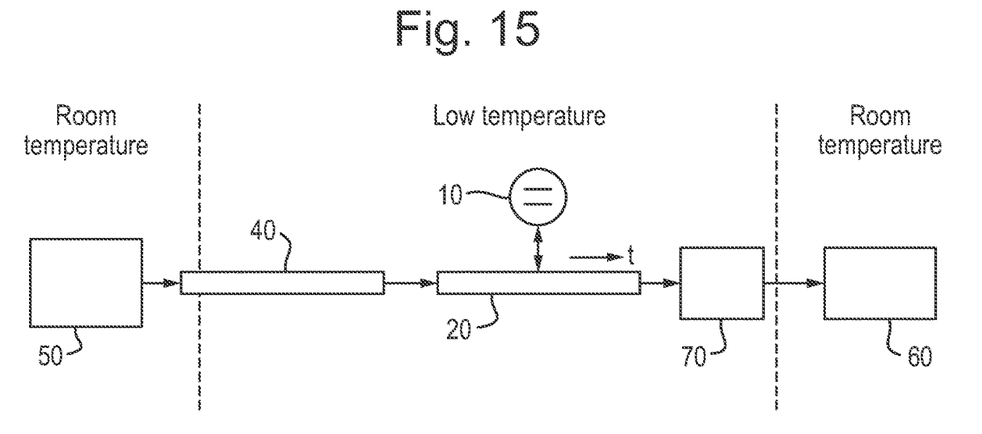
FIG. 15 depicts an arrangement of an embodiment of the invention to measure the effect of a low-temperature device.

FIG. 15 depicts a similar arrangement to measure the input power to a subject device 70. This arrangement is operated in essentially the same manner as that of FIG. 14. The arrangement of FIG. 15 is effective if the subject device transmits the spectrum generated by the two-level system without excessive distortion but it does not matter if the spectrum is amplified or attenuated. Desirably, the transmission of the device is substantially constant across a bandwidth equal to the difference between the two drive signals, e.g. less than 1 kHz. The two-level system can be placed after the subject device to measure the output thereof. Two-level systems can be placed both before and after the subject device to measure both input and output power. Two such two-level systems are used sequentially, with the unused system detuned, e.g. by adjusting the charge or flux bias.

Figure 16:
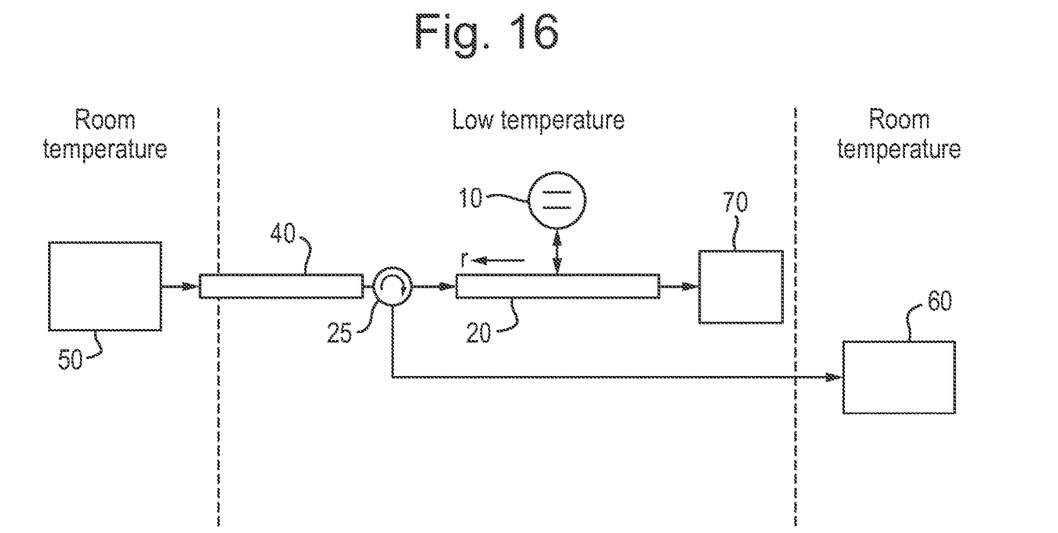
FIG. 16 depicts an arrangement of an embodiment of the invention to measure the power input to a low-temperature device.

In FIG. 16, a quantum power sensor according to an embodiment of the invention is used to measure the power input to a subject device 70 when no output from that device is available or the subject device would alter the power spectrum of its output. In this arrangement, a coupler or circulator 25 is provided between transmission line 40 and transmission line 20 and directs the reflected signal r from two-level quantum system 10 to spectrum analyser 60. Coupler 25 has directivity and may be a circulator or directional coupler.

Figure 17:
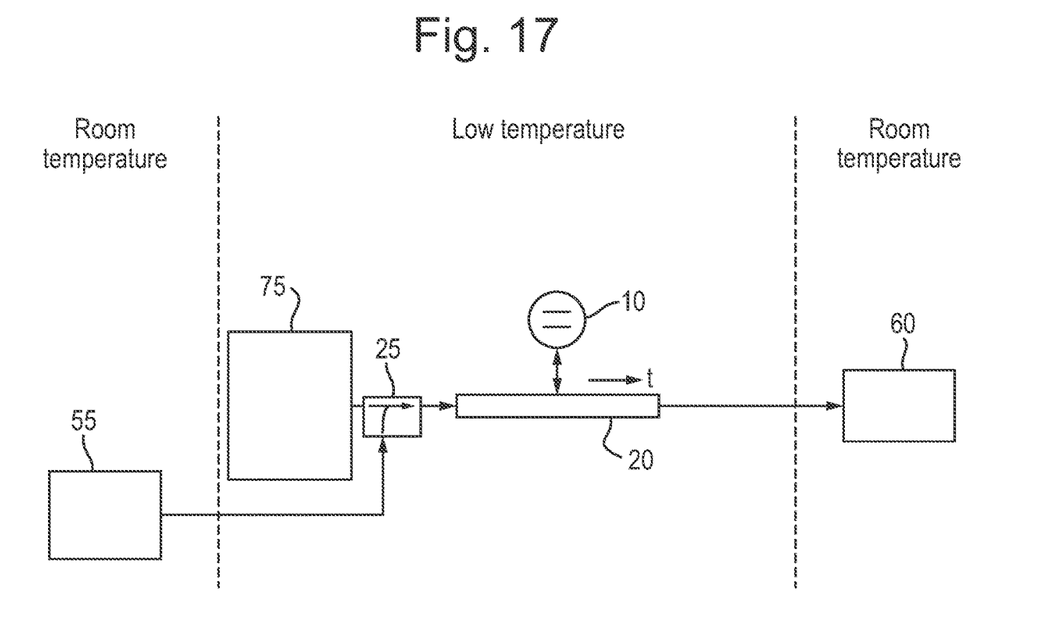
FIG. 17 depicts an arrangement of an embodiment of the invention to measure the power output of a source or device.

To measure the output of an unknown power source or subject device 75, an arrangement such as shown in FIG. 17 can be employed. This arrangement is effective if it is not possible or convenient to transmit a probe signal through it. One or multiple control source(s) 55 provides a probe signal which is mixed with the output of the subject device 75 via coupler 25. Coupler 25 has directivity and may be a circulator or directional coupler. The probe signal provided by control source(s) 55 is used for calibration of the quantum power sensor.

Figure 18:
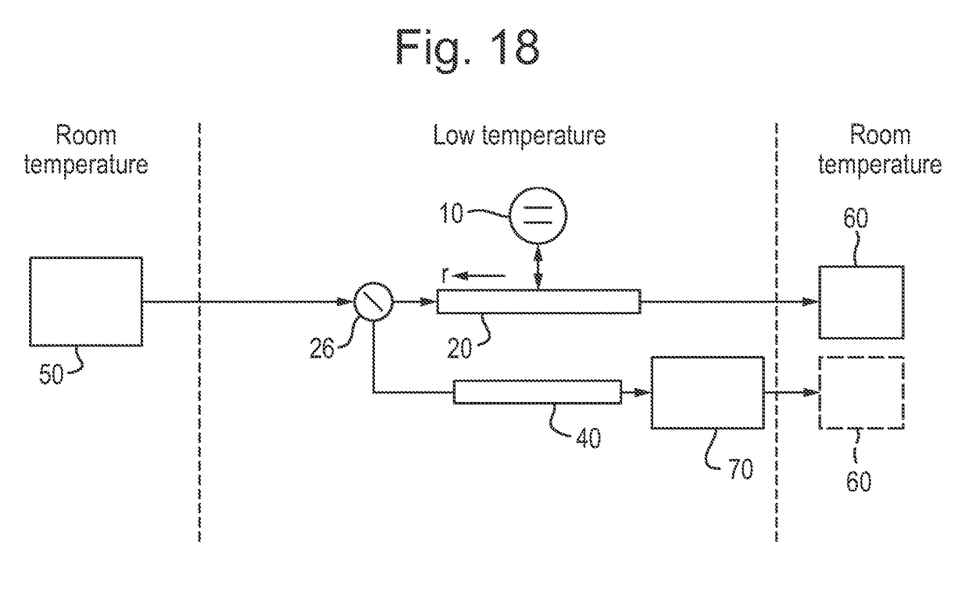
FIG. 18 depicts an arrangement of an embodiment of the invention to measure the power input to a source or device.

A further arrangement to measure the power input to a transmission line or device is shown in FIG. 18. A splitter 26 is provided with one branch going to a two-level system power sensor 10 according to an embodiment of the invention and the other to a transmission line 40 or other device 70. Since a splitter can be calibrated, the absolute power in the branch going to the transmission line 40 or device 70 can be deduced using two-level system 10. This gives the advantage to the user that they can perform other experiments in the other branch of the line (ensuring the two-level system is not interfering) while knowing the exact input power.

Embodiments of the present invention may be employed in any system that uses microwaves at cryogenic temperatures. Embodiments of the present invention can be used for determining the power delivered to or emitted from any microwave device at low temperature. A plurality of quantum power sensors according to the invention can be used to determine the power on all ports of any multi-port microwave device. Specific quantum technologies in which the invention is useful include: qubits, superconducting resonators, and circuits consisting of any number of such elements together with other on-chip microwave components such as filters, circulators. Embodiments of the present invention are also useful for calibration of coaxial cables and other transmission lines as well as cryogenic amplifiers (such as HEMTs, parametric amplifiers, travelling wave parametric amplifiers, etc.), as well as any typical microwave component intended for cryogenic use. Embodiments of the present invention may also be employed with nanoelectronic devices, other superconducting quantum devices (not qubits) and electromechanical quantum devices, as well as for materials characterisation and any other application that uses microwaves at low temperatures.

Embodiments of the present invention can be employed to measure power of microwave signals in the GHz range, for example in the range of from 1 GHz to 50 GHz. The bottom end of the frequency range to which a quantum power sensor of the present invention is sensitive, may depend on the temperature of operation. Operation at about 50 mK can enable sensitivity down to about 1 GHz. Embodiments of the invention can also be configured to operate at higher frequencies, e.g. in the THz range using different types of two-level quantum systems.

Embodiments of the present invention desirably operate at low temperatures, e.g. below about 5 K, below about 1.3 K, below about 0.5 K or below about 100 mK. The temperature of operation primarily depends on the superconducting transition temperature of any superconducting components of the two-level quantum system. High temperature superconductors and other two-level systems not based on superconductors may enable operation at higher temperature.

Having described exemplary embodiments of the invention, it will be appreciated that modifications and variations of the described embodiments can be made. For example, multiple quantum power sensors can be used in a complex system to measure power at different places in the system. The invention is not to be limited by the foregoing description but only by the appended claims.

The invention claimed is:

1. A quantum power sensor comprising a two-level quantum system coupled to a transmission line that supports a propagating wave; and an analyser for determining a coupling coefficient and a Rabi frequency of the two-level quantum system; and
    wherein the coupling coefficient is deduced by measuring a relative amplitude of a third and higher order mixing product and the Rabi frequency is measured by resonance fluorescence measurements; or
    wherein the coupling coefficient and the Rabi frequency are deduced by measuring a relative amplitude and frequency and power dependences of third and higher order mixing products as a result of driving the two-level system with two or more frequencies.

2. A quantum power sensor according to claim 1 wherein the transmission line has a bandwidth of 0.5 GHz or more, desirably 1.0 GHz or more.

3. A quantum power sensor according to claim 1 wherein the analyser is configured to operate at room temperature.

4. A quantum power sensor system according to claim 1 wherein the two-level quantum system is capacitively coupled to the transmission line.

5. A quantum power sensor system according to claim 1 wherein the two-level quantum system is inductively coupled to the transmission line.

6. A quantum power sensor or a measurement system according to claim 1 wherein the two-level quantum system is a system selected from the group consisting of: superconducting qubits; single-electron two-level systems; nuclear spin qubits; quantum dots; defect qubits; and trapped ion qubits.

7. A quantum power sensor system according to claim 1 wherein the two-level quantum system and the transmission line are configured to operate at low temperatures.

8. A method of measuring power in a transmission line, the method comprising:
  coupling a two-level quantum system to the transmission line; and
  determining a coupling coefficient and a Rabi frequency of the two-level system;
  wherein the coupling coefficient is deduced by measuring a relative amplitude of a third and higher order mixing product and the Rabi frequency is measured by resonance fluorescence measurements.

9. A method of measuring power in a transmission line, the method comprising:
  coupling a two-level quantum system to the transmission line; and
  determining coupling coefficient and a Rabi frequency of the two-level system;
  wherein the coupling and the Rabi frequency are deduced by measuring a relative amplitude and frequency and power dependences of third and higher order mixing products as a result of driving the two-level system with two or more frequencies.

* * * * *